United States Patent
Ren

(10) Patent No.: US 10,283,027 B2
(45) Date of Patent: May 7, 2019

(54) DUAL GATE ARRAY SUBSTRATE, TESTING METHOD, DISPLAY PANEL AND DISPLAY APPARATUS

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventor: Xinfeng Ren, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/534,526

(22) PCT Filed: Jun. 27, 2016

(86) PCT No.: PCT/CN2016/087237
§ 371 (c)(1),
(2) Date: Jun. 9, 2017

(87) PCT Pub. No.: WO2017/161722
PCT Pub. Date: Sep. 28, 2017

(65) Prior Publication Data
US 2018/0061291 A1 Mar. 1, 2018

(30) Foreign Application Priority Data
Mar. 24, 2016 (CN) .......................... 2016 1 0173093

(51) Int. Cl.
G09G 3/00 (2006.01)
G01R 31/28 (2006.01)
(Continued)

(52) U.S. Cl.
CPC ......... G09G 3/006 (2013.01); G01R 31/2815 (2013.01); H01L 27/12 (2013.01);
(Continued)

(58) Field of Classification Search
CPC .. G01R 31/025; G01R 31/021; G01R 31/024; G01R 31/11; G01R 31/086
(Continued)

(56) References Cited

U.S. PATENT DOCUMENTS 7,084,940 B2 * 8/2006 Nimura ............. G02F 1/133553
349/113
9,425,219 B2 8/2016 Shi et al.
(Continued)

FOREIGN PATENT DOCUMENTS

CN 1746757 A 3/2006
CN 101566744 A 10/2009
(Continued)

OTHER PUBLICATIONS

International Search Report and Written Opinion for International Application No. PCT/CN2016/087237 dated Dec. 1, 2016.
(Continued)

*Primary Examiner* — Christopher P McAndrew
(74) *Attorney, Agent, or Firm* — Calfee, Halter & Griswold LLP

(57) ABSTRACT

A dual gate array substrate is disclosed. In two vertically adjacent pixel pairs, two pixel units in each of the pixel pairs are connected to the same data line of the two adjacent data lines respectively, and two adjacent pixel units in the two pixel pairs in an extending direction of the data line are connected to different data lines in the two adjacent data lines respectively; in two adjacent pixel pairs in an extending direction of any set of the dual gate lines, a data line connected to two pixel units in one pixel pair is different
(Continued)

from but adjacent to a data line connected to two pixel units in the other pixel pair; and two adjacent pixel units in the extending direction of the data line are connected to their respective adjacent gate lines transmitting different scan signals respectively.

7 Claims, 8 Drawing Sheets

(51) Int. Cl.
    *H01L 27/12*     (2006.01)
    *H01L 27/28*     (2006.01)
    *H01L 29/786*     (2006.01)

(52) U.S. Cl.
    CPC ........ *H01L 27/124* (2013.01); *H01L 27/1259* (2013.01); *H01L 27/283* (2013.01); *H01L 29/78648* (2013.01); *G09G 2300/0426* (2013.01); *G09G 2330/10* (2013.01)

(58) Field of Classification Search
    USPC .......................................... 324/527
    See application file for complete search history.

(56) References Cited

U.S. PATENT DOCUMENTS

| | | | |
|---|---|---|---|
| 9,608,125 B2* | 3/2017 | Cai | H01L 22/34 |
| 9,869,914 B2* | 1/2018 | Huang | H01L 27/1244 |
| 2008/0117345 A1* | 5/2008 | Ishii | G02F 1/136204 349/40 |
| 2009/0101940 A1* | 4/2009 | Barrows | H03K 19/1778 257/204 |
| 2012/0120034 A1* | 5/2012 | Lee | G09G 3/3677 345/205 |
| 2013/0141660 A1* | 6/2013 | Wang | G02F 1/136286 349/43 |
| 2015/0236043 A1 | 8/2015 | Shi et al. | |
| 2015/0355517 A1* | 12/2015 | Huang | H01L 27/1244 257/72 |
| 2016/0035302 A1 | 2/2016 | Sun et al. | |

FOREIGN PATENT DOCUMENTS

| | | |
|---|---|---|
| CN | 103197480 A | 7/2013 |
| CN | 103514846 A | 1/2014 |
| CN | 104155820 A | 11/2014 |
| CN | 104200786 A | 12/2014 |
| CN | 105336304 A | 2/2016 |

OTHER PUBLICATIONS

Second Office Action for Chinese Patent Application No. 201610173093.7 dated Nov. 26, 2018.

\* cited by examiner

DUAL GATE ARRAY SUBSTRATE, TESTING METHOD, DISPLAY PANEL AND DISPLAY APPARATUS

CROSS REFERENCE

This application is based upon International Application No. PCT/CN2016/087237, filed on Jun. 27, 2016, which claims priority to Chinese Patent Application No. 201610173093.7, filed on Mar. 24, 2016, the contents thereof are incorporated herein by reference in its entirety as a part of this application.

TECHNICAL FIELD

The present disclosure relates to a field of display, and more particularly, to a dual gate array substrate, a testing method, a display panel and a display apparatus.

BACKGROUND

In general, a display apparatus may be for example, classified into a cathode ray tube display CRT, a plasma display PDP, a liquid crystal display LCD, a light emitting diode LED display, an organic light emitting diode OLED display and the like, depending on different manufacturing materials. At present, flat panel displays such as LCD and LED displays have gradually replaced traditional displays such as CRTs, and they are widely used in various industries and become an indispensable component of most electronic devices.

In a display such as an LCD display and an LED display, an array substrate is a main component. In the array substrate, the pixel units are periodically arranged. Each pixel unit may include a thin film transistor (TFT) and a pixel electrode, and each pixel electrode is driven by connecting a data line and a gate line to the TFT. In general, the data line is connected to a source electrode of the thin film transistor, the gate line is connected to a gate electrode of the thin film transistor, and the pixel electrode is connected to a drain electrode of the thin film transistor.

In the single gate array substrate, if a structure of the array substrate includes N*M pixel units, the single gate array substrate may include N gate lines and M data lines. A pixel unit is arranged at an intersection of the gate line and the data line. A combination of different gate lines and data lines may drive different pixel units.

In order to reduce cost of a product, a dual gate array substrate is provided. By comparing with the above single gate array substrate, in the dual gate array substrate, the number of data lines may be substantially reduced by half, and the number of gate lines is substantially doubled. Since the number of data lines in the dual gate array substrate is reduced, the cost of a drive circuit (IC) connected to the data lines is correspondingly reduced, thereby reducing the cost of the product.

However, in an array test of the dual gate array substrate, an existing dual gate array substrate usually leads to a problem of low pixel detection rate, resulting in low product quality control, which leads to the increase of related cost. For example, in the production process of the dual gate array substrate, pixel defects caused by an indium tin oxide (ITO) residue may occur. However, in the array test of the dual gate array substrate in the prior art, defective pixels caused by conductive material residues are not detectable in some cases. Therefore, an improved dual gate array substrate is required.

It should be noted that, information disclosed in the above background portion is provided only for better understanding of the background of the present disclosure, and thus it may contain information that does not form the prior art known by those ordinary skilled in the art.

SUMMARY

According to one aspect of the present disclosure, there is disclosed a dual gate array substrate. The dual gate array substrate comprises a plurality of sets of dual gate lines, a plurality of data lines, and a plurality of pixel pairs arranged in an area defined by the plurality of sets of dual gate lines and the plurality of data lines, wherein each set of the dual gate lines comprises two gate lines for transmitting a first scan signal and a second scan signal respectively, and relative orientations of the two gate lines in each set of the dual gate lines are the same, each of the pixel pairs comprises two pixel units, in two pixel pairs within an area defined by two sets of dual gate lines adjacent to any set of the dual gate lines and two adjacent data lines, two pixel units in each of the pixel pairs are connected to the same data line of the two adjacent data lines respectively, and two adjacent pixel units in the two pixel pairs in an extending direction of the data line are connected to different data lines in the two adjacent data lines respectively; in two adjacent pixel pairs in an extending direction of any set of the dual gate lines, a data line connected to two pixel units in one pixel pair is different from but adjacent to a data line connected to two pixel units in the other pixel pair; and two adjacent pixel units in the extending direction of the data line are connected to their respective adjacent gate lines transmitting different scan signals respectively, and two adjacent pixel units in the extending direction of any set of the dual gate lines are connected to their respective adjacent gate lines transmitting different scan signals respectively.

According to another aspect of the present disclosure, there is disclosed a dual gate array substrate, comprising: a plurality of sets of gate lines extending in a first direction; a plurality of data lines extending in a second direction perpendicular to the first direction; and a plurality of pixel pairs arranged in a matrix formed by the plurality of sets of gate lines and the plurality of data lines. Wherein each pixel pair comprises a first pixel unit and a second pixel unit between two adjacent data lines, the first pixel unit is connected to a first adjacent gate line in an adjacent set of gate lines, and the second pixel unit is connected to a second adjacent gate line in another adjacent set of gate lines, and wherein in a first pixel pair, the first pixel unit and the second pixel unit are connected to a first data line of the two adjacent data lines.

According to another aspect of the present disclosure, there is disclosed a method for testing the above dual gate array substrate, wherein each gate line is sequentially numbered from 1 in the extending direction of the data line, the method comprises:

providing scan signals with the same timing to gate lines numbered 1+3i, i being a natural number, and performing following steps:

(a) transmitting a data signal to one of the two adjacent data lines, and if a driven pixel unit and any one of the pixel units adjacent to the driven pixel unit are simultaneously driven, determining that a short circuit may exist between the driven pixel unit and the any one of the pixel units adjacent to the driven pixel unit;

(b) interrupting transmission of the data signal to the one of the two adjacent data lines, transmitting a data signal to the other of the two adjacent data lines, and if a driven pixel unit and any one of the pixel units adjacent to the driven pixel unit are simultaneously driven, determining that a short circuit may exist between the driven pixel unit and the any one of the pixel units adjacent to the driven pixel unit;

interrupting provision of any data signal and scan signal, providing scan signals with the same timing to gate lines numbered 2+3i, and performing the above steps (a) and (b); and interrupting provision of any data signal and scan signal, providing scan signals with the same timing to gate lines numbered 3+3i, and performing the above steps (a) and (b).

According to another aspect of the present disclosure, there is disclosed a display panel, at least comprising a dual gate array substrate described above.

According to another aspect of the present disclosure, there is disclosed a display apparatus, at least comprising a display panel described above.

It is to be understood that both the foregoing general description and the following detailed description are exemplary and explanatory only and are not restrictive of the invention, as claimed.

This section provides a summary of various implementations or examples of the technology described in the disclosure, and is not a comprehensive disclosure of the full scope or all features of the disclosed technology.

BRIEF DESCRIPTION OF THE DRAWINGS

Reference is now made to the accompanying drawings, which are merely exemplary and not necessarily drawn to scale. In the drawings.

In the drawings, for ease of understanding, similar reference numerals have been used to refer to elements that have substantially the same or similar structure and/or function.

DETAILED DESCRIPTION

Figure 1:
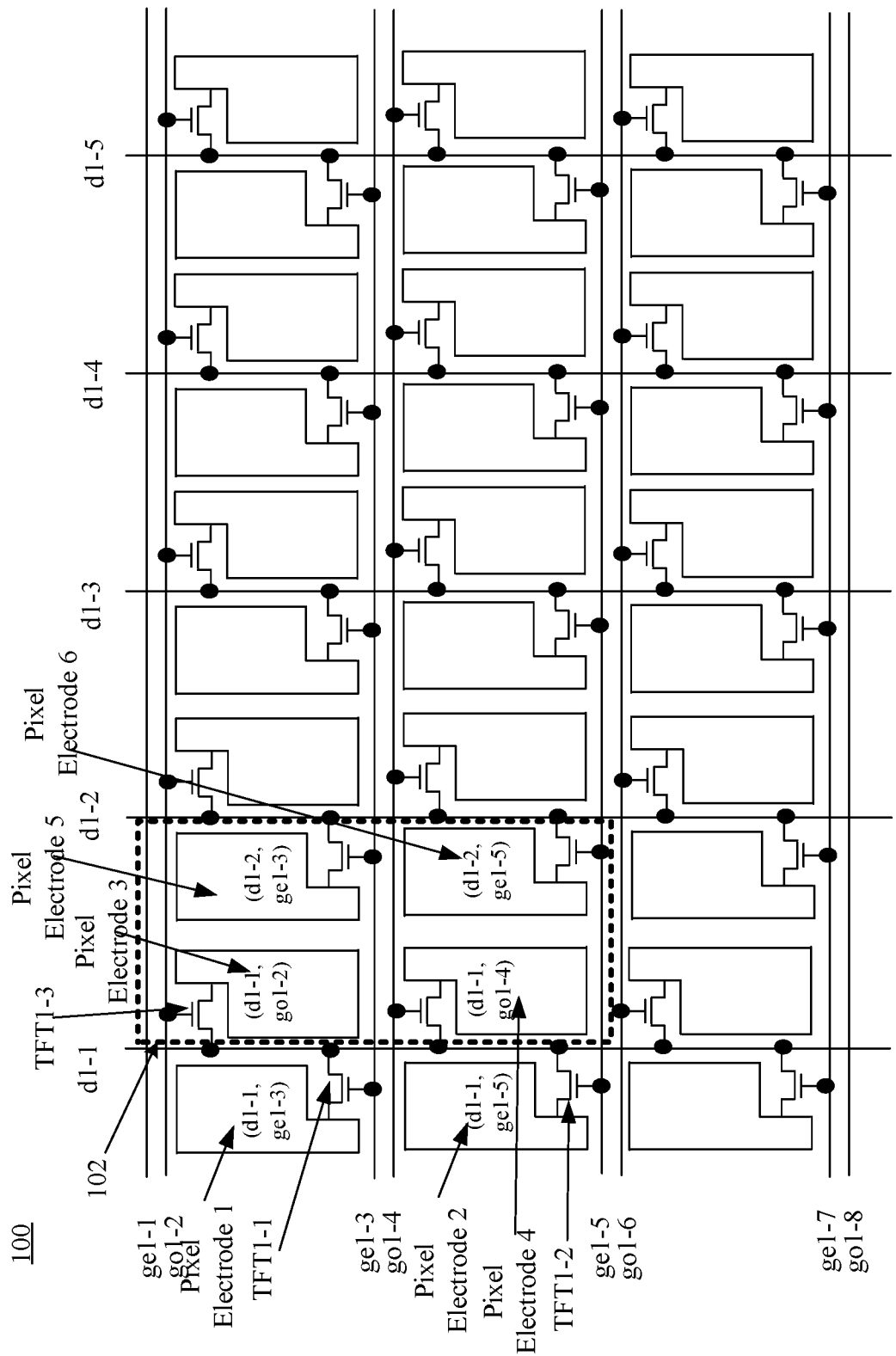
FIG. 1 schematically illustrates a dual gate array substrate.

Embodiments of the present disclosure will now be described with reference to the drawings hereinafter. In following description, numerous specific details are set forth in order to provide a more complete understanding and implementation of the present disclosure for those skilled in the art. However, it will be apparent to those skilled in the art that the implementation of the present disclosure does not need to have some specific details of these specific details. In addition, it should be understood that the present disclosure is not limited to the specific embodiments described. Rather, it is contemplated that the present disclosure may be implemented with any combination of features and elements described below, whether or not they relate to different embodiments. Accordingly, following aspects, features, embodiments and advantages are for illustrative purposes only and are not to be regarded as elements or limitations of the claims, unless expressly stated in the claims.

As used herein, a gate line containing "ge" in the reference numeral is defined as a gate line for transmitting a first scan signal, and a gate line containing "go" in the reference numeral is defined as a gate line for transmitting a second scan signal. The gate line containing "go" in the reference numeral and the gate line containing "ge" in the reference numeral are defined as being different. The data lines with different reference numerals are defined as being different. As used herein, in the drawings, reference numerals of pixel electrodes may be used as reference numerals of pixel units containing the pixel electrodes.

As used herein, the pixel electrode may comprise a transparent conductive film, such as an ITO film, a zinc indium oxide (IZO) film, a zinc gallium oxide (ZGO) film, a zinc indium gallium oxide (IZGO) film, a zinc oxide (ZnO) film, an AZO (aluminum zinc oxide) film, or other transparent conductive films that may be applied or developed in the future.

FIG. 1 schematically shows a structure of a dual gate array substrate 100. The dual gate array substrate 100 as shown in FIG. 1 comprises a plurality of sets of dual gate lines, a plurality of data lines, and a plurality of pixel pairs arranged in an area defined by the plurality of sets of dual gate lines and the plurality of data lines. In the dual gate array substrate 100, each pixel unit contains a thin film transistor TFT and a pixel electrode connected to the TFT. The pixel units in the dual gate array substrate 100 are arranged in a matrix. Horizontal solid lines indicated by "ge" denote gate lines ge1-1, ge1-3, ge1-5, ge1-7, which are used to transmit a first scan signal. Horizontal solid lines indicated by "go" denote gate lines go1-2, go1-4, go1-6, go1-8, which are used to transmit a second scan signal. Longitudinal solid lines indicate data lines d1-1, d1-2, d1-3, d1-4, d1-5. In a longitudinal direction, two gate lines between two adjacent pixel units are defined as a set of dual gate lines. For example, a set of dual gate lines, such as ge1-3 and go1-4, is arranged between a pixel unit 1 and a pixel unit 2. Each set of dual gate lines comprises two gate lines for transmitting the first scan signal and the second scan signal. A data line, for example, d1-2, is arranged every two pixel units (such as a pixel unit 3 and a pixel unit 5) in the pixel units of the same row in the dual gate array substrate 100. TFTs are connected to their adjacent data lines and gate lines, respectively, and connection manners of the TFTs in the pixel units of the same column in the dual gate array substrate 100 are basically the same. For example, a source electrode and the gate electrode of the TFT 1-1 are connected to the data line d1-1 and the gate line ge1-3, respectively, and a source electrode and a gate electrode of the TFT 1-2 in the same column as the TFT 1-1 are connected to the data line d1-1 and the gate line ge1-5, respectively. Gate electrodes of the TFTs in adjacent pixel units of the same row in the dual gate array substrate 100 are connected to the gate lines for transmitting different scan signals respectively. For example, the gate electrode of the TFT 1-1 is connected to the gate line ge1-3 for transmitting the first scan signal, and the gate electrode of the adjacent TFT 1-3 is connected to the gate line go1-2 for transmitting the second scan signal.

Referring to FIG. 1, as shown in block 102, in two pixel pairs (pixel units 3, 4, 5, 6) in an area defined by two sets of dual gate lines ((ge1-1, go1-2) and (ge1-5, go1-6)) adjacent to one set of the dual gate lines (ge1-3, go1-4) and two adjacent data lines (d1-1, d1-2), the pixel unit 3 is driven by (d1-1, go1-2), the pixel unit 4 is driven by (d1-1, go1-4); the pixel unit 5 is driven by (d1-2, ge1-3), and the pixel unit 6 is driven by (d1-2, ge1-5). Since the gate lines go1-2 and go1-4 may transmit the second scan signals of the same timing, the driving of two pixel units (for example, the pixel unit 3 and the pixel unit 4) in the above two pixel pairs in the dual gate array substrate 100 is the same. Similarly, since the gate lines ge1-3 and ge1-5 may transmit the first scan signals of the same timing, the driving of the pixel unit 5 and the pixel unit 6 is the same.

Figure 2:
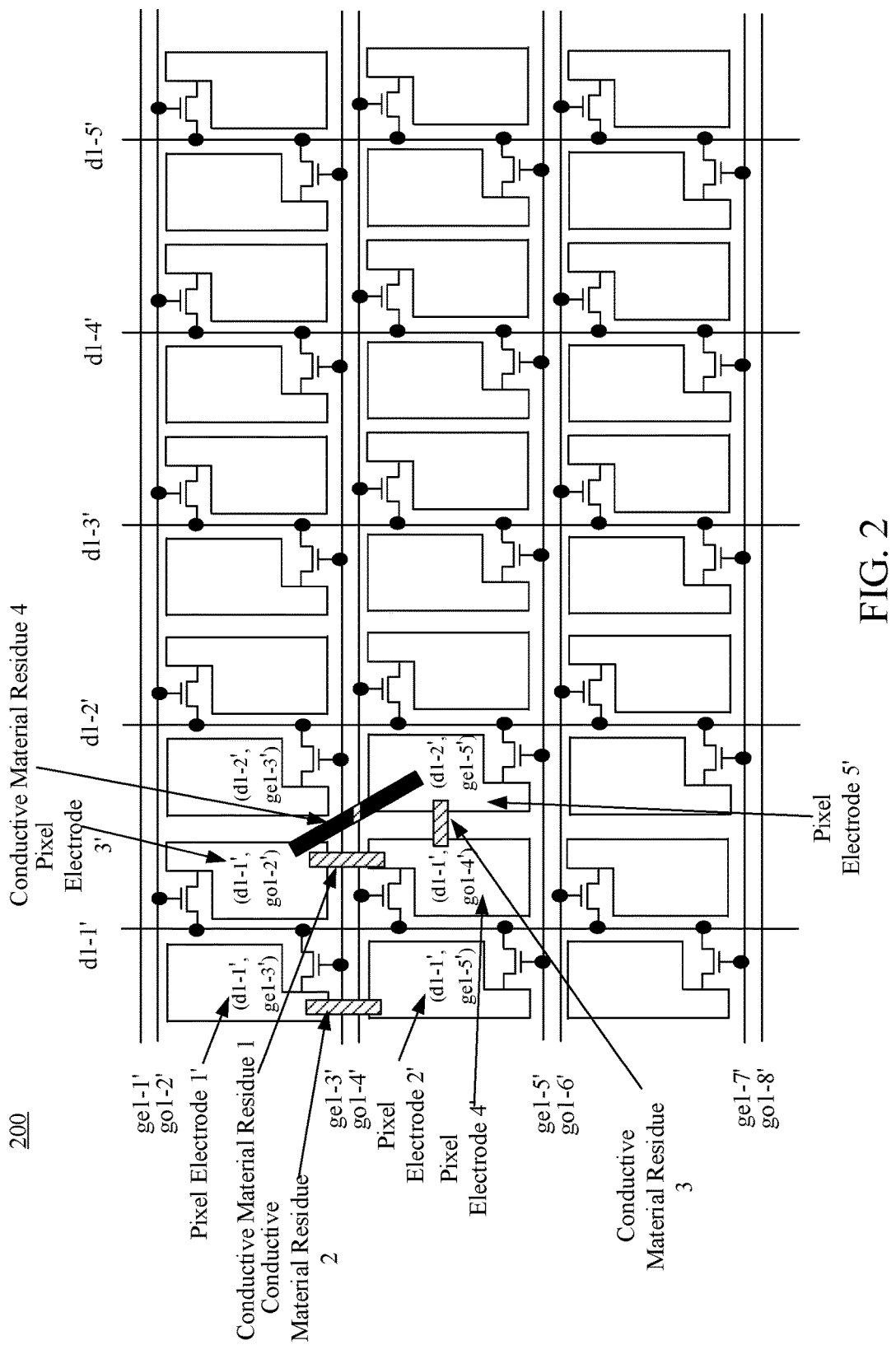
FIG. 2 schematically illustrates a dual gate array substrate of FIG. 1 with conductive material residues.

However, in production of the dual gate array substrate, conductive material (e.g., material for fabricating pixel electrodes, such as ITO) residues exist inevitably, resulting in a short circuit (or interconnection) between adjacent pixel units. FIG. 2 schematically shows a dual gate array substrate 200 having conductive material residues.

Referring to FIG. 2, a structure of the dual gate array substrate 200 of FIG. 2 is basically the same as that of the dual gate array substrate 100 as shown in FIG. 1. The structure of the dual gate array substrate 200 is not described in detail herein for conciseness. Further, the difference between the dual gate array substrate 200 and the dual gate array substrate 100 lies in that, conductive material (e.g. ITO) residues, for example, conductive material residues 2, conductive material residues 1, conductive material residues 3 and conductive material residues 4, exist between a pixel electrode 1' and a pixel electrode 2', between a pixel electrode 3' and a pixel electrode 4', between the pixel electrode 4' and a pixel electrode 5', and between the pixel electrode 3' and the pixel electrode 5'. In this case, in a certain array test of the dual gate array substrate 200, for example, when a data signal is supplied to the data line d1-1' and a first scan signal is supplied to the gate line for transmitting the first scan signal, since the driving (d1-1', ge1-3') of the pixel electrode 1' is the same as the driving (d1-1', ge1-5') of the pixel electrode 2', the pixel electrode 1' and the pixel electrode 2' may be driven simultaneously and obtain basically the same voltage level, no matter whether or not the conductive material residues 2 exist between the pixel electrode 1' and the pixel electrode 2', such that the conductive material residues 2 between the pixel electrode 1' and the pixel electrode 2' cannot be detected. Similarly, for example, when a data signal is supplied to the data line d1-1' and a second scan signal is supplied to the gate line for transmitting the second scan signal, the conductive material residues 1 between the pixel electrode 3' and the pixel electrode 4' cannot be detected either. The driving (d1-1', go1-2') of the pixel electrode 3' and the driving (d1-2', ge1-5') of the pixel electrode 5' are different, and the driving (d1-2', ge1-5') of the pixel electrode 5' and the driving (d1-1', go1-4') of the pixel electrode 4' are different, it is assumed that only one pixel electrode among them is driven during a period of time, if its adjacent pixel electrode is also driven, it may be detected that conductive material residues may exist therebetween or they may be short-circuited.

As described above, the driving of some adjacent pixel electrodes is the same in the above dual gate array substrate (for example, the dual gate array substrate 100, 200), therefore, in the array test on the above dual gate array substrate, the conductive material residues may result in a low pixel detection rate, for example, the adjacent pixel units having conductive material residues may be detected as being qualified. In addition, although there may be other array test methods to detect the above-mentioned conductive material residues, it may result in increased cost related to the array test, such as time cost, production cost, and the like.

Aiming at the above defects in the above dual gate array substrate, an embodiment of the present disclosure provides an improved dual gate array substrate. The dual gate array substrate according to an embodiment of the present disclosure comprises: a plurality of sets of dual gate lines, a plurality of data lines, and a plurality of pixel pairs arranged in an area defined by the plurality of sets of dual gate lines and the plurality of data lines, wherein each set of the dual gate lines comprises two gate lines for transmitting a first scan signal and a second scan signal respectively, and relative orientations of the two gate lines in each set of the dual gate lines are the same, each of the pixel pairs comprises two pixel units, in two pixel pairs within an area defined by two sets of dual gate lines adjacent to any set of the dual gate lines and two adjacent data lines, two pixel units in each of the pixel pairs are connected to the same data line of the two adjacent data lines respectively, and two adjacent pixel units in the two pixel pairs in an extending direction of the data line are connected to different data lines in the two adjacent data lines respectively; in two adjacent pixel pairs in an extending direction of any set of the dual gate lines, a data line connected to two pixel units in one pixel pair is different from but adjacent to a data line connected to two pixel units in the other pixel pair; and two adjacent pixel units in the extending direction of the data line are connected to their respective adjacent gate lines transmitting different scan signals respectively, and two adjacent pixel units in the extending direction of any set of the dual gate lines are connected to their respective adjacent gate lines transmitting different scan signals respectively. The dual gate array substrates according to some embodiments of the present disclosure will be described and explained in detail below with reference to FIGS. 3-5.

Figure 3:
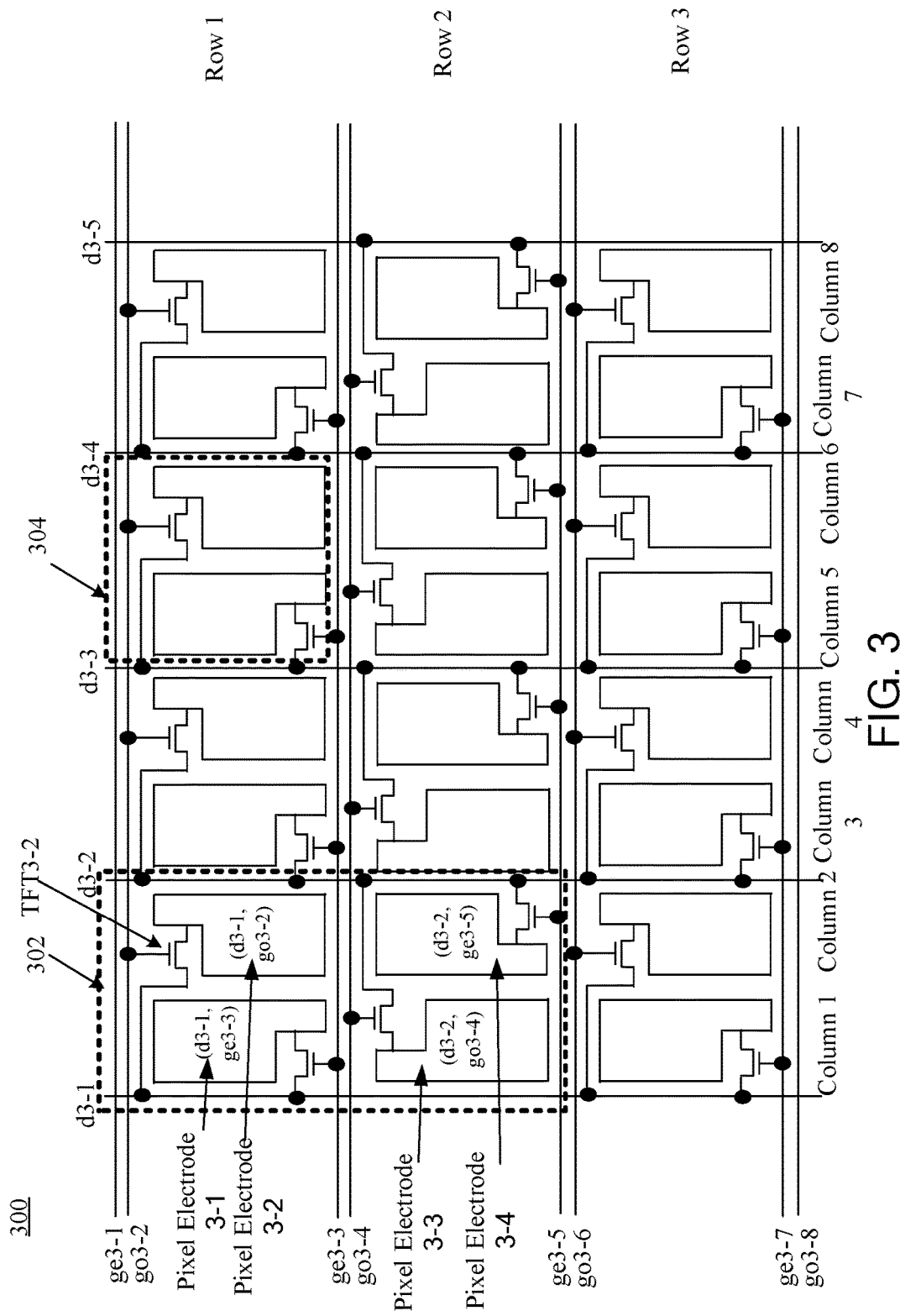
FIG. 3 schematically illustrates a dual gate array substrate according to an exemplary embodiment of the present disclosure.

FIG. 3 schematically illustrates a dual gate array substrate 300 according to an exemplary embodiment of the present disclosure. The dual gate array substrate 300 comprises a plurality of sets of dual gate lines, a plurality of data lines, and a plurality of pixel pairs arranged in an area defined by the plurality of sets of dual gate lines and the plurality of data lines. Each set of the dual gate lines comprises two gate lines for transmitting a first scan signal and a second scan signal respectively, and relative orientations of the two gate lines in each set of the dual gate lines are the same. For example, the gate line for transmitting the first scan signal is located above the gate line for transmitting the second scan signal. In other embodiments, the gate line for transmitting the first scan signal is located below the gate line for transmitting the second scan signal. Each pixel pair comprises two pixel units. In the dual gate array substrate 300, each pixel unit contains a thin film transistor TFT and a pixel electrode connected to the TFT. The pixel units in the dual gate array substrate 300 are arranged in a matrix. Horizontal solid lines indicated by "ge" denote gate lines ge3-1, ge3-3, ge3-5, ge3-7, which are used to transmit a first scan signal. Horizontal solid lines indicated by "go" denote gate lines go3-2, go3-4, go3-6, go3-8, which are used to transmit a second scan signal. Longitudinal solid lines indicate data lines d3-1, d3-2, d3-3, d3-4, d3-5. In a longitudinal direction, two gate lines between two adjacent pixel units are defined as a set of dual gate lines. For example, a set of dual gate lines, such as ge3-3, go3-4, is arranged between a pixel unit 3-1 and a pixel unit 3-3. Each set of dual gate lines comprises two gate lines for transmitting the first scan signal and the second scan signal. A data line, for example, d3-2, is arranged every two pixel units (such as a pixel unit 3-1 and a pixel unit 3-2) in the pixel units of the same row in the dual gate array substrate 300. A pixel pair in an area defined by one set of dual gate lines adjacent to any set of the dual gate lines and two adjacent data lines comprises two pixel units. A pixel pair in block 304 as shown in FIG. 3 comprises two pixel units.

As shown in FIG. 3, in the structure of the dual gate array substrate 300, in two pixel pairs within an area defined by two sets of dual gate lines adjacent to any set of the dual gate lines and two adjacent data lines, two pixel units in each of the pixel pairs are connected to the same data line of the two adjacent data lines respectively. For example, in two pixel pairs in block 302 as shown in FIG. 3, pixel units 3-1 and 3-2 in one pixel pair are connected to the same data line d3-1, and pixel units 3-3 and 3-4 of the other pixel pair are connected to the same data line d3-2. In addition, two adjacent pixel units in the two pixel pairs in an extending direction of the data line are connected to different data lines in the two adjacent data lines respectively. For example, in two pixel pairs in block 302 as shown in FIG. 3, in the extending direction of the data line d3-1, the pixel unit 3-1 is connected to the data line d3-1 while the pixel unit 3-3 adjacent to the pixel unit 3-1 in the extending direction is connected to a different data line d3-2.

In addition, in two adjacent pixel pairs in an extending direction of any set of the dual gate lines, a data line connected to two pixel units in one pixel pair is different from but adjacent to a data line connected to two pixel units in the other pixel pair. For example, in the extending direction of the dual gate lines ge3-1 and go3-2, the data line to which the pixel pair (pixel units 3-1 and 3-2) are connected is d3-1, while the data line to which the pixel pair (pixel units 3-5 and 3-6) adjacent to the pixel pair (pixel units 3-1 and 3-2) is d3-2, and the data lines d3-1 and d3-2 are adjacent to each other.

In addition, the two adjacent pixel units in the extending direction of the data line are connected to their respective adjacent gate lines transmitting different scan signals respectively, and two adjacent pixel units in the extending direction of any set of the dual gate lines are connected to their respective adjacent gate lines transmitting different scan signals respectively. For example, in FIG. 3, the two adjacent pixel units 3-1 and 3-3 in the extending direction of the data line d3-1 are connected to their respective adjacent gate lines ge3-3 and go3-4 transmitting different scan signals respectively. Two adjacent pixel units in the extending direction of any set of the dual gate lines are connected to their respective adjacent gate lines transmitting different scan signals respectively. For example, in FIG. 3, two adjacent pixel units 3-1 and 3-2 in the extending direction of one set of the dual gate lines ge3-3 and go3-4 are connected to their respective adjacent gate lines ge3-3 and go3-2 transmitting different scan signals respectively.

In the dual gate array substrate 300, the driving of only two pixel units on a diagonal among four adjacent pixel units across two lines on both sides of one data line is the same. However, in the dual gate array substrates 100 and 200 as shown in FIGS. 1 and 2, in two pixel pairs within an area defined by two sets of dual gate lines adjacent to any set of the dual gate lines and two adjacent data lines, the driving of two adjacent unit pixels in the extending direction of the data line is the same. That is, the number of the adjacent pixel units with the same driving in the dual gate array substrate 300 is reduced by 50% as compared with the dual gate array substrates 100 and 200. Thus, the array test of the dual gate array substrate 300 may be easier. Hereinafter, the test of the dual gate array substrate 300 will be described in detail.

According to various embodiments, each of the pixel units comprises a pixel electrode and a thin film transistor; a gate electrode of the thin film transistor is connected to the gate line, a source electrode of the thin film transistor is connected to the data line, and a drain electrode of the thin film transistor is connected to the pixel electrode. As shown in FIG. 3, the pixel unit 3-2 comprises a pixel electrode 3-2 and a TFT 3-2, a gate electrode of the TFT 3-2 is connected to the gate line go3-2, the source electrode of the TFT 3-2 is connected to the data line d3-1, and the drain electrode of the TFT 3-2 is connected to the pixel electrode 3-2.

According to various embodiments, the timing of the first scan signal and the second scan signal is different. For example, in a display apparatus using a dual gate array substrate 300, one of the scan signals may be transmitted at the same time.

Figure 4:
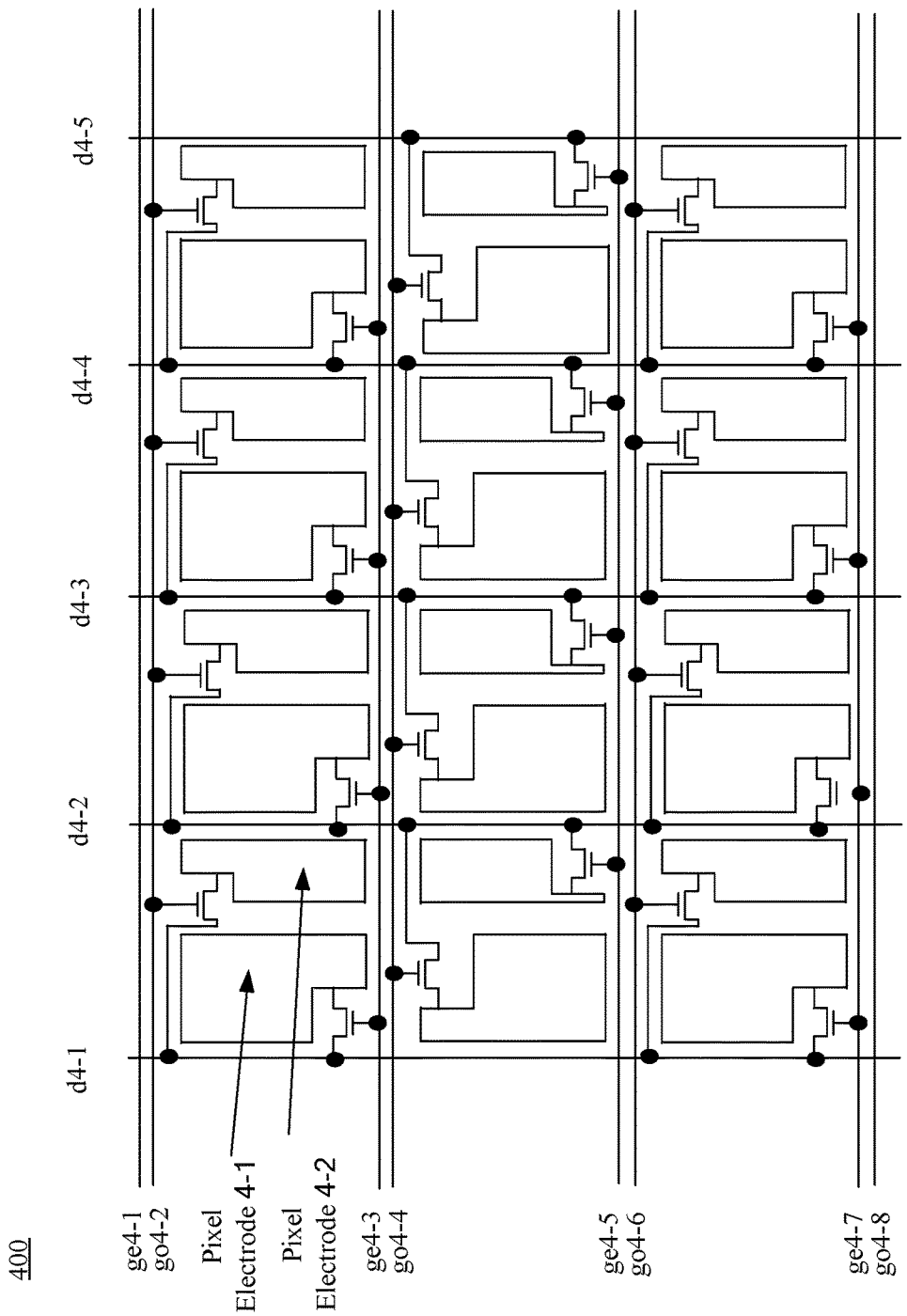
FIG. 4 schematically illustrates a dual gate array substrate according to another exemplary embodiment of the present disclosure.

According to various embodiments, the pixel electrodes of the dual gate array substrate may have different sizes and/or shapes. FIG. 4 shows a dual gate array substrate 400 having pixel electrodes of different sizes according to an embodiment of the present disclosure.

As shown in FIG. 4, the dual gate array substrate 400 is arranged in a manner basically the same as that of the dual gate array substrate 300 as shown in FIG. 3, expect for different sizes of pixel electrodes (for example, a pixel electrode 4-1 and a pixel electrode 4-2), which will not be described in detail herein. In one embodiment, sizes and/or shapes of the pixel electrodes of the dual gate array substrates 300 and 400 may correspond to the pentile arrangement manner. In other embodiments, sizes and shapes of the pixel electrodes of the dual gate array substrates 300 and 400 may be any size and shape that may be applied or developed in the future. In addition, it should be noted that the size and shape of the pixel electrodes of the dual gate array substrates 300 and 400 are merely examples.

Figure 5:
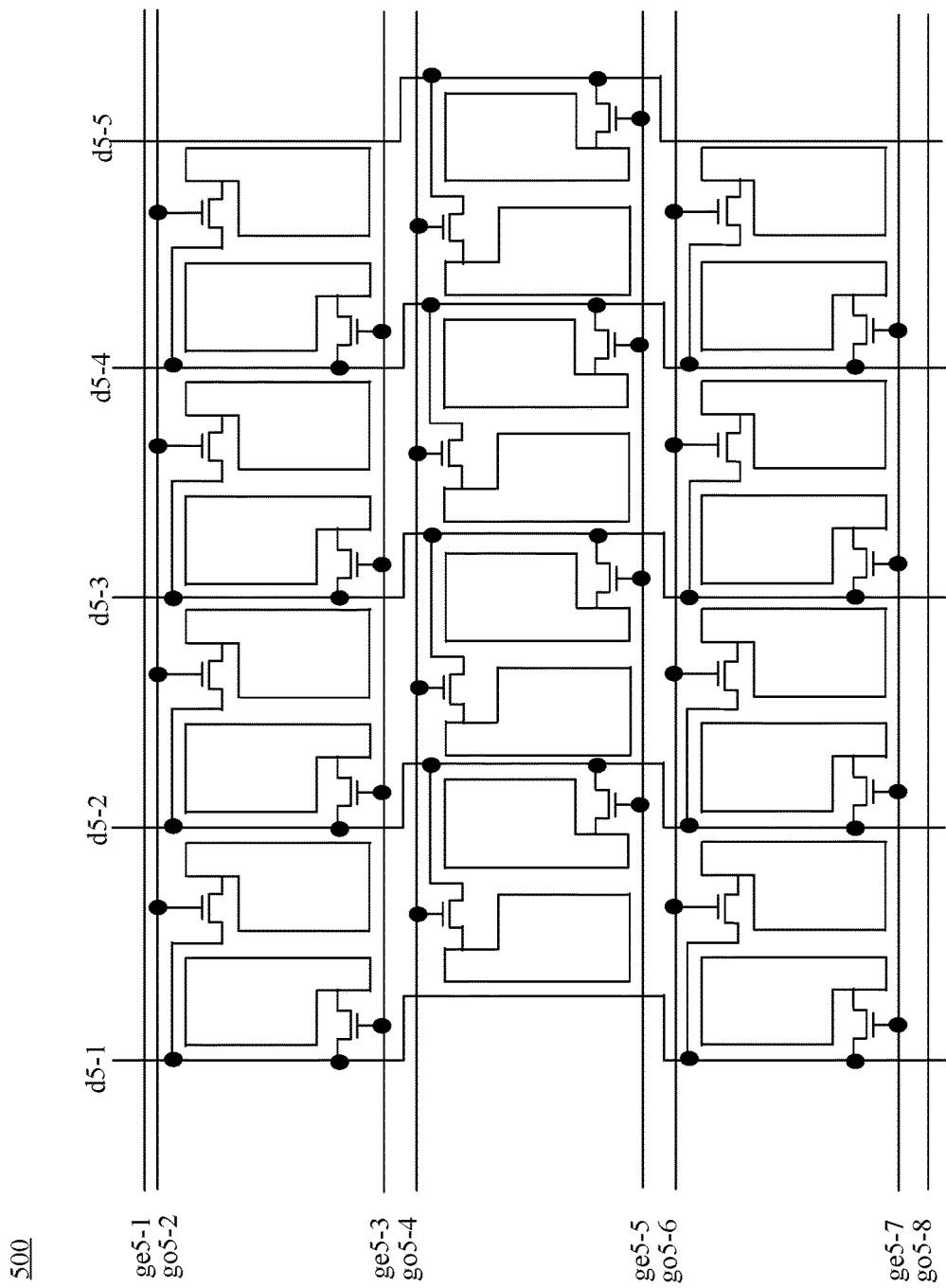
FIG. 5 schematically illustrates a dual gate array substrate according to another exemplary embodiment of the present disclosure.

According to various embodiments, the pixel electrode may be arranged in a stripe-shaped structure or a triangular structure. The pixel electrodes of the dual gate array substrates 300 and 400 in FIGS. 3-4 are arranged in stripe-shaped structures, in which the pixel electrodes of each column are substantially aligned and the pixel electrodes of each row are substantially aligned. In the triangular structure, the pixel electrodes of each row are arranged substantially aligned, while the pixel electrodes of each column are not aligned. FIG. 5 schematically shows a dual gate array substrate 500 in which pixel electrodes are arranged in a triangular structure. The arrangement of the dual gate array substrate 500 is substantially the same as that of the dual gate array substrates 300 and 400 as shown in FIGS. 3 and 4, except that the pixel electrodes are arranged in a triangular structure, which will not be described in detail herein.

In other embodiments, the pixel electrodes of the dual gate array substrates 300, 400, and 500 may also be arranged in any other structures that may be applied or developed in the future, which is not limited by the present disclosure.

According to various embodiments of the present disclosure, the dual gate array substrates 300, 400 and 500 may also comprise a common electrode ($V_{com}$). For example, in an array substrate of an IPS (In-Plane Switching) type, the common electrode may be disposed on the dual gate array substrate. In addition, a structure of the common electrode may be a mesh structure or any other suitable structure that is known or to be developed in the future, which is not limited by the present disclosure.

According to various embodiments of the present disclosure, the TFT may be any one of an inorganic thin film transistor or an organic thin film transistor. The inorganic thin film transistor may comprise an amorphous silicon thin film transistor, a polysilicon thin film transistor or the like. In other embodiments, the TFT may be any thin film transistor that may be applied or developed in the future. In addition, TFTs may be transparent.

According to various embodiments of the present disclosure, the dual gate array substrates 300, 400, and 500 may be any dual gate array substrate made of flexible material that is known or developed in the future.

In addition, it should be noted that, for purposes of illustration and explanation of exemplary embodiments of the present disclosure, FIGS. 3-5 are merely examples of dual gate array substrates according to embodiments of the present disclosure. In an actual dual gate array substrate, the data lines and the gate lines are not necessarily straight lines, and may be of any suitable and specific shape and wiring. In addition, the shape and size of the pixel electrode are merely examples. In addition, the dual gate array substrates 300, 400, and 500 may contain any suitable number of pixel units. In addition, in some embodiments, the dual gate array substrates 300, 400, and 500 may also have other components.

The embodiment of the present disclosure further discloses a method for testing dual gate array substrates according to embodiments of the present disclosure. In the embodiment, each gate line is sequentially numbered in the extending direction of the data line, and the number starts from 1. It should be noted that, in other embodiments, the number may begin with any suitable figure.

Figure 6:
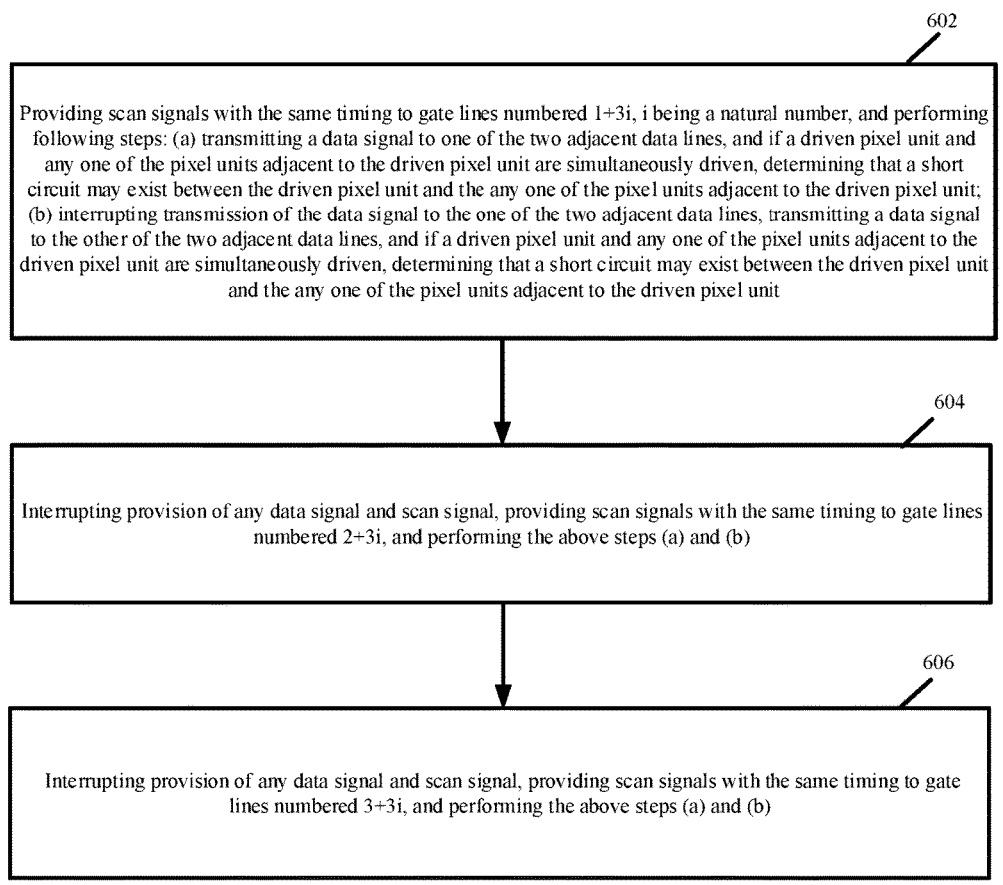
FIG. 6 schematically illustrates a flow chart of a test method of a dual gate array substrate according to an exemplary embodiment of the present disclosure.
Figure 7:
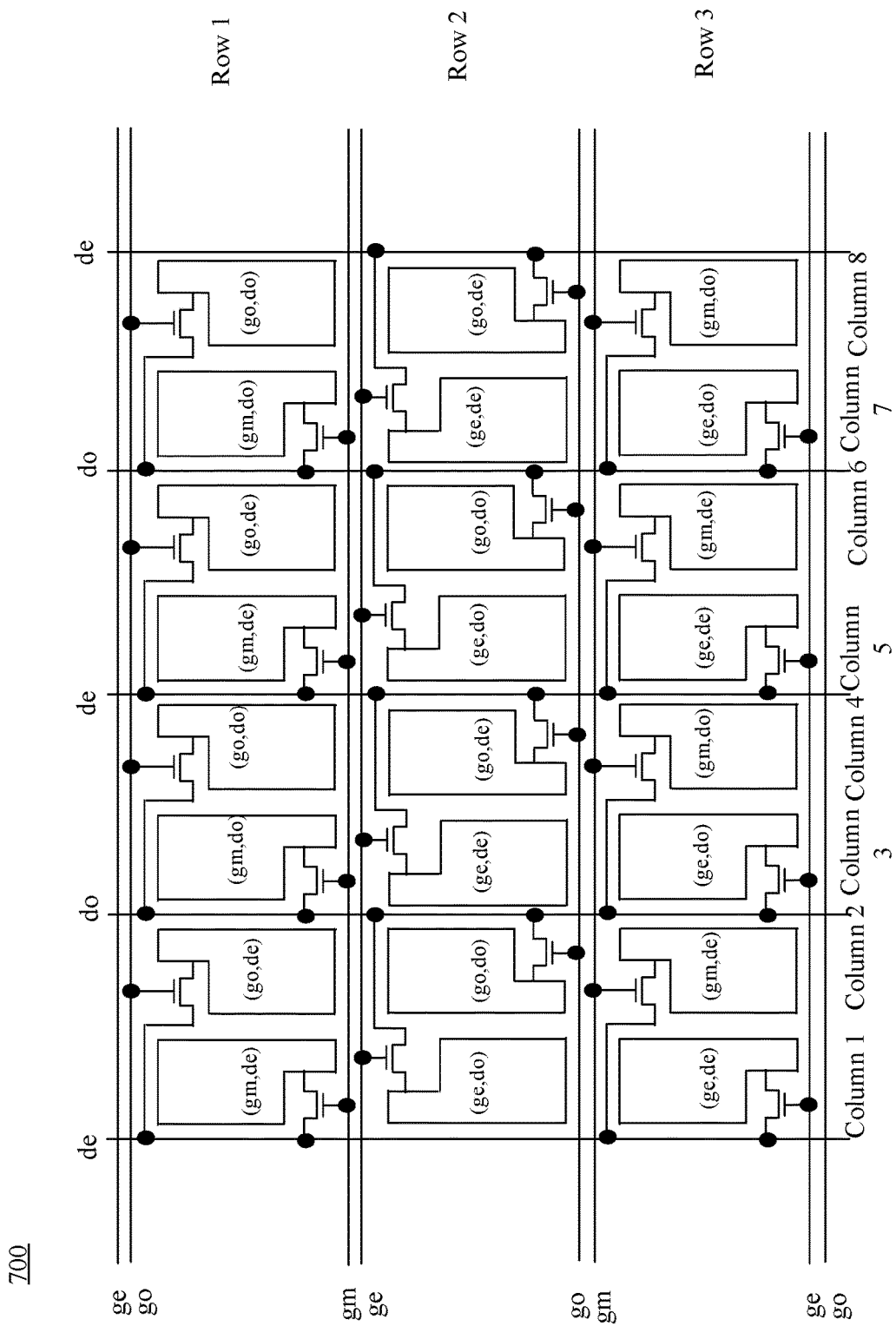
FIG. 7 schematically illustrates a driving result of the pixel unit for testing the dual gate array substrate of FIG. 3 according to the test method of FIG. 6.

FIG. 6 illustrates a flow chart of a test method of a dual gate array substrate according to an exemplary embodiment of the present disclosure. FIG. 7 illustrates a driving result of the pixel unit according to the test method of FIG. 6. In FIG. 7, "ge" represents gate lines numbered 1+3i, "go" represents gate lines numbered 2+3i, "gm" represents gate lines numbered 3+3i, i is a natural number. One data line of adjacent data lines is represented by "de", and the other data line is represented by "do". The test method of the dual gate array substrate will be described below with reference to FIGS. 6-7.

In step 602, scan signals with the same timing are provided to gate lines numbered 1+3i, i is a natural number, and following steps are performed: (a) transmitting a data signal to one of the two adjacent data lines, and if a driven pixel unit and any one of the pixel units adjacent to the driven pixel unit are simultaneously driven, determining that a short circuit may exist between the driven pixel unit and the any one of the pixel units adjacent to the driven pixel unit. Referring to FIG. 7, in step (a), a data signal is provided to the data line "de", and a scan signal of the same timing is supplied to the gate line "ge", such that the pixel unit connected to the data line "de" and the gate line "ge" is driven, for example, a pixel unit of the second row and the third column is driven. If a pixel unit is driven, any pixel unit adjacent thereto will not be driven. Referring to FIG. 7, the pixel unit of the second row and the third column is driven, and none of the pixel units adjacent thereto is driven. Therefore, if the driven pixel unit and any pixel unit adjacent to the driven pixel unit are simultaneously driven, it may be determined that a short circuit may exist between the driven pixel unit and the any one of the pixel units adjacent to the driven pixel unit. For example, the array substrate may be optically and/or electrically detected at this time, to find pixel units that may be short-circuited.

Then, step (b) is performed: interrupting transmission of the data signal to the one of the two adjacent data lines, transmitting a data signal to the other of the two adjacent data lines, and if a driven pixel unit and any one of the pixel units adjacent to the driven pixel unit are simultaneously driven, determining that a short circuit may exist between the driven pixel unit and the any one of the pixel units adjacent to the driven pixel unit. Referring to FIG. 7, in step (b), the provision of the data signal to the data line "de" is interrupted, and the data signal is supplied to the data line "do", while the provision of the scan signal with the same timing to the gate line "ge" is continued, so that the pixel unit connected to the data line "do" and the gate line "ge" is driven, for example, a pixel unit of the second row and the fifth column is driven. If a pixel unit is driven, any pixel unit adjacent thereto will not be driven. Referring to FIG. 7, the pixel unit of the second row and the fifth column is driven, and none of the pixel units adjacent thereto is driven. Therefore, if the driven pixel unit and any pixel unit adjacent to the driven pixel unit are simultaneously driven, it may be determined that a short circuit may exist between the driven pixel unit and the any one of the pixel units adjacent to the driven pixel unit. As state above, the array substrate may be optically and/or electrically detected at this time, to find pixel units that may be short-circuited.

In step 604, provision of any data signal and scan signal is interrupted, scan signals with the same timing are provided to gate lines numbered 2+3i, and the above steps (a) and (b) are performed. Referring to FIG. 7, in step (a), a data signal is provided to the data line "de", and a scan signal of the same timing is supplied to the gate line "go", such that the pixel unit connected to the data line "de" and the gate line "go" is driven, for example, a pixel unit of the second row and the fourth column is driven. If a pixel unit is driven, any pixel unit adjacent thereto will not be driven. Referring to FIG. 7, the pixel unit of the second row and the fourth column is driven, and none of the pixel units adjacent thereto is driven. Therefore, if the driven pixel unit and any pixel unit adjacent to the driven pixel unit are simultaneously driven, it may be determined that a short circuit may exist between the driven pixel unit and the any one of the pixel units adjacent to the driven pixel unit. As stated above, the array substrate may be optically and/or electrically detected at this time, to find pixel units that may be short-circuited. In step (b), a data signal is supplied to the data line "do", and the scan signal with the same timing is supplied to the gate line "go", so that the pixel unit connected to the data line "do" and the gate line "go" is driven, for example, a pixel unit of the second row and the second column is driven. If a pixel unit is driven, any pixel unit adjacent thereto will not be driven. Referring to FIG. 7, the pixel unit of the second row and the second column is driven, and none of the pixel units adjacent thereto is driven. Therefore, if the driven pixel unit and any pixel unit adjacent to the driven pixel unit are simultaneously driven, it may be determined that a short circuit may exist between the driven pixel unit and the any one of the pixel units adjacent to the driven pixel unit. As state above, the array substrate may be optically and/or electrically detected at this time, to find pixel units that may be short-circuited.

In step 606, provision of any data signal and scan signal is interrupted, scan signals with the same timing are provided to gate lines numbered 3+3i, and the above steps (a) and (b) are performed. Referring to FIG. 7, in step (a), a data signal is provided to the data line "de", and a scan signal of the same timing is supplied to the gate line "gm", such that the pixel unit connected to the data line "de" and the gate line "gm" is driven, for example, a pixel unit of the first row and the fifth column is driven. If a pixel unit is driven, any pixel unit adjacent thereto will not be driven. Referring to FIG. 7, the pixel unit of the first row and the fifth column is driven, and none of the pixel units adjacent thereto is driven. Therefore, if the driven pixel unit and any pixel unit adjacent to the driven pixel unit are simultaneously driven, it may be determined that a short circuit may exist between the driven pixel unit and the any one of the pixel units adjacent to the driven pixel unit. As stated above, the array substrate may be optically and/or electrically detected at this time, to find pixel units that may be short-circuited. In step (b), a data signal is supplied to the data line "do", and the scan signal with the same timing is supplied to the gate line "gm", so that the pixel unit connected to the data line "do" and the gate line "gm" is driven, for example, a pixel unit of the first row and the third column is driven. If a pixel unit is driven, any pixel unit adjacent thereto will not be driven. Referring to FIG. 7, the pixel unit of the first row and the third column is driven, and none of the pixel units adjacent thereto is driven. Therefore, if the driven pixel unit and any pixel unit adjacent to the driven pixel unit are simultaneously driven, it may be determined that a short circuit may exist between the driven pixel unit and the any one of the pixel units adjacent to the driven pixel unit. As state above, the array substrate may be optically and/or electrically detected at this time, to find pixel units that may be short-circuited.

Figure 8:
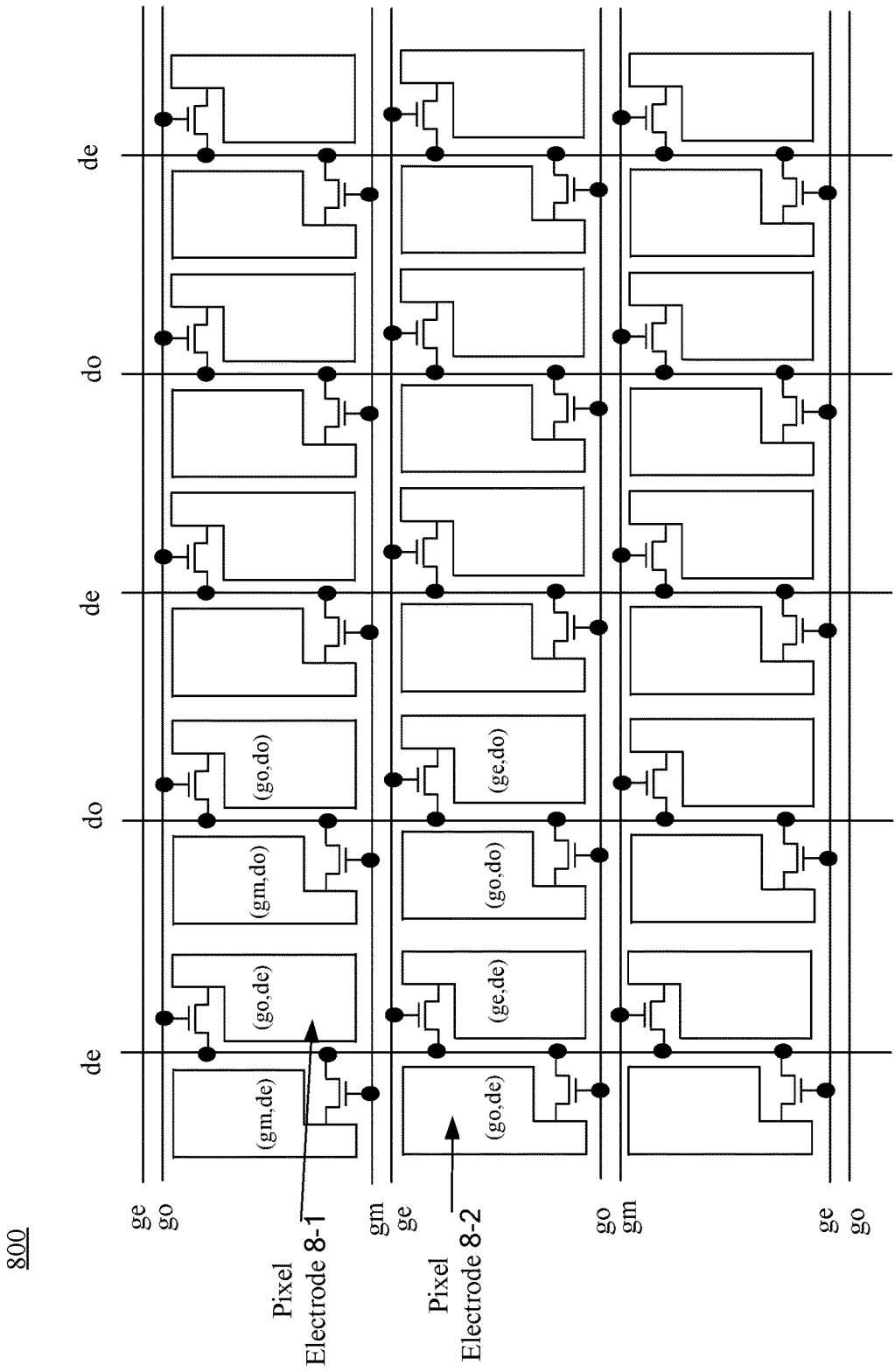
FIG. 8 schematically illustrates a driving result of the pixel unit for testing the dual gate array substrate of FIG. 1 according to the test method of FIG. 6.

In contrast, in the dual gate array substrate 100, a signal same as above is provided. If a pixel unit is driven, a pixel unit adjacent thereto is also driven. For example, FIG. 8 illustrates a driving result of a part of the pixel unit in the dual gate array substrate 100 by providing the signal same as above. It can be seen from FIG. 8 that, when a data signal is supplied to the data line "de" and a scan signal of the same timing is supplied to the gate line "ge", a pixel unit 8-1 and a pixel unit 8-2 are driven simultaneously. Thus, a more complex and/or time-consuming approach may be required for an array test of the dual gate array substrates 100. Thus, in comparison, the test method of the dual gate array substrate of the present disclosure is simpler and more efficient, with a higher pixel detection rate and lower cost.

According to various embodiments of the present disclosure, there is provided a display panel, at least comprising the above dual gate array substrates according to embodiments of the present disclosure. For example, the display panels may be various types of display panels such as LCDs, OLEDs, or display panels to be developed in the future.

According to various embodiments of the present disclosure, there is provided a display apparatus, at least comprising a display panel as described above. For example, the display apparatus may be various types of display apparatuses such as LCDs, OLEDs, or display apparatuses to be developed in the future, which comprise the display panels described above.

Although embodiments of the present disclosure have been described above with reference to the accompanying drawings, it will be understood by those skilled in the art that the foregoing description is exemplary only and is not intended to limit the present disclosure. Various modifications and variations of embodiments of the present disclosure may be made therein, while still falling within the spirit and scope of the present disclosure. The scope of the present disclosure is determined only by the appended claims.

What is claimed is:

1. A method for testing a dual gate array substrate comprising a plurality of sets of dual gate lines, a plurality of data lines, and a plurality of pixel pairs arranged in an area defined by the plurality of sets of dual gate lines and the plurality of data lines,
   wherein each set of the dual gate lines comprises two gate lines for transmitting a first scan signal and a second scan signal respectively, and relative orientations of the two gate lines in each set of the dual gate lines are the same,
   each of the pixel pairs comprises two pixel units,
   wherein in two pixel pairs within an area defined by two sets of dual gate lines adjacent to any set of the dual gate lines and two adjacent data lines, two pixel units in each of the pixel pairs are connected to the same data line of the two adjacent data lines respectively, and two adjacent pixel units in the two pixel pairs in an extending direction of the data line are connected to different data lines in the two adjacent data lines respectively;
   in two adjacent pixel pairs in an extending direction of any set of the dual gate lines, a data line connected to two pixel units in one pixel pair is different from but adjacent to a data line connected to two pixel units in the other pixel pair; and
   two adjacent pixel units in the extending direction of the data line are connected to their respective adjacent gate lines transmitting different scan signals respectively, and two adjacent pixel units in the extending direction of any set of the dual gate lines are connected to their respective adjacent gate lines transmitting different scan signals respectively,
   wherein each gate line is sequentially numbered from 1 in the extending direction of the data line, the method comprises:
   providing scan signals with the same timing to gate lines numbered 1+3i and not providing scan signals to other gate lines, i being a natural number, and performing the following steps:
   (a) transmitting a data signal to one of the two adjacent data lines, and in the case where a first pixel unit and any one of the pixel units adjacent to the first pixel unit are simultaneously driven, determining that a short circuit exists between the first pixel unit and the any one of the pixel units adjacent to the first pixel unit;
   (b) interrupting transmission of the data signal to the one of the two adjacent data lines, transmitting a data signal to the other of the two adjacent data lines, and in the case where a second pixel unit and any one of the pixel units adjacent to the second pixel unit are simultaneously driven, determining that a short circuit exists between the second pixel unit and the any one of the pixel units adjacent to the second pixel unit;
   interrupting provision of any data signal and scan signal, providing scan signals with the same timing to gate lines numbered 2+3i, and performing the above steps (a) and (b); and
   interrupting provision of any data signal and scan signal, providing scan signals with the same timing to gate lines numbered 3+3i, and performing the above steps (a) and (b).

2. The method according to claim 1, wherein each of the pixel units comprises a pixel electrode and a thin film transistor; a gate electrode of the thin film transistor is connected to the gate line, a source electrode of the thin film transistor is connected to the data line, and a drain electrode of the thin film transistor is connected to the pixel electrode.

3. The method according to claim 2, wherein the pixel electrode has different sizes and/or shapes.

4. The method according to claim 2, wherein the pixel electrode is arranged in a stripe-shaped structure or a triangular structure.

5. The method according to claim 2, wherein the thin film transistor is any one of an inorganic thin film transistor or an organic thin film transistor.

6. The method according to claim 1, wherein timings of the first scan signal and the second scan signal are different.

7. The method according to claim 2, further comprising a common electrode.

* * * * *